United States Patent [19]

Feldman

[11] Patent Number: 5,621,309

[45] Date of Patent: Apr. 15, 1997

[54] METHOD FOR DETECTING A FAILED ZNO DISK IN A SURGE ARRESTER NETWORK

[75] Inventor: James M. Feldman, Newtown, Mass.

[73] Assignee: Electric Power Research Institute, Palo Alto,, Calif.

[21] Appl. No.: 604,177

[22] Filed: Feb. 21, 1996

[51] Int. Cl.[6] .................................................. G01R 31/02
[52] U.S. Cl. ............................ 324/72; 324/547; 324/551; 340/647
[58] Field of Search ...................................... 324/546, 547, 324/549, 551, 552, 72, 509; 361/39, 40, 117; 340/646, 647

[56] References Cited

U.S. PATENT DOCUMENTS

| 4,075,549 | 2/1978 | Woodward | 324/551 X |
|---|---|---|---|
| 4,157,496 | 6/1979 | St-Jean | 324/72 X |
| 4,259,666 | 3/1981 | Takahashi et al. | 324/72 X |
| 4,507,701 | 3/1985 | Fujiwara et al. | 324/72 X |
| 4,803,436 | 2/1989 | Kresge et al. | 324/549 |
| 4,866,393 | 9/1989 | Iwai et al. | 324/549 |
| 5,087,885 | 2/1992 | Bergstrom | 324/547 |

Primary Examiner—Kenneth A. Wieder
Assistant Examiner—Diep Do
Attorney, Agent, or Firm—Flehr, Hohbach, Test, Albritton & Herbert

[57] ABSTRACT

A method of detecting failed disks in power-system surge arresters comprising a network of at least two parallel-coupled stacks of series-coupled ZnO varistors includes measuring differential current flow through each pair of stacks during surge voltage conditions, and comparing the current so measured with a fixed fraction of the total current carried by the arrester. Because each stack contains a like number of substantially identical varistors, current flow through the stack containing a failed disk will measurably exceed current flow through each non-defective stack. If the measured current flow through a stack is excessive relative to current flow through the remaining stacks, the excessive current flow stack is presumed to contain a defective disk. In today's technology, precision Rogowski coils or fiber-optic current sensors provide the high-bandwidth, high dynamic-range transducers necessary for the measurement of both total and differential current.

11 Claims, 5 Drawing Sheets

METHOD FOR DETECTING A FAILED ZNO DISK IN A SURGE ARRESTER NETWORK

FIELD OF THE INVENTION

The present invention relates to high-voltage surge arresters, and more particularly to a method for detecting failed disks within a zinc-oxide (ZnO) surge arrester before catastrophic failure of the arrester.

BACKGROUND OF THE INVENTION

Lightning arresters shield power system and customer equipment from high voltage surges that arise from natural and man-made causes and travel along the transmission system. For example, electrical power lines are frequently struck by lightning. Such strikes can launch extremely high voltage transients along the lines. High transient voltage surges may also be created as utility company circuit breakers switch to clear a system fault (disconnect a short circuit). Such transients are called "switching surges".

Regardless of the origin of the transient, machinery and other equipment coupled to power lines may be damaged or destroyed by the high voltage surges that many reach megavolts in peak amplitude. The duration of high voltage surges may be in the range of hundreds of nanoseconds to hundreds of microseconds, and the magnitude of the surge current may exceed tens of KA.

It is known in the art to shield systems and equipment from high voltage surges by placing, as close as practical to the system being protected, highly non-linear shunt elements which serve as voltage clamps. Such shunt devices are called "arresters". Since the incoming transient is an electromagnetic wave traveling on a transmission line, the action of an arrester is to serve as "mirror" or "shield," reflecting a substantial fraction of the incoming wave back from the protected equipment. To act as a reflector of surges while allowing the normal power to flow by, the arrester must turn on very abruptly at a voltage appropriate to a small surge, while remaining non-conducting at voltages appropriate to normal operation. In the older forms of arrester, the switching action was accomplished with a spark gap. Once the gap broke down, the voltage across the arrester was determined by a non-linear resistor of SiC disks, a semiconductor of somewhat ill-defined composition with the useful property that the voltage across it was almost constant, independent of current. The arrester gap would stay on until the transient voltage dropped below the voltage of the stack of SiC. Non-linear resistive elements are called "varistors."

More modern arresters combine the action of switching and voltage clamping in varistor itself. These modern varistors are made of ZnO, another semiconductor that makes an even more non-linear resistor than SiC. The current I through a ZnO varistor increases considerably faster than the voltage V across the varistor, in fact, as I $\alpha$ V$^n$, where n$\geq$25.

While ZnO varistors conduct at any voltage, the extreme non-linearity of the I-V relationship suggests defining a threshold value $V_{th}$, such that if $V<V_{th}$, current flow I through the varistor is considered negligible. Above $V_{th}$, the arrester "turns on" very abruptly. So abruptly, in fact, that the varistor effectively clamps the voltage across it to $\pm V_{th}$. This clamping action acts as a shield between the transient and the equipment to be protected.

The varistor clamping action may be described as being a differential short circuit that reflects much (ideally, all) of the surge power back into the power transmission system, where it is dispersed and dissipated. The term "reflected" is well chosen. The incoming surge is a coupled wave of current and voltage whose ratio, $V/I=Z_0$, a constant that is determined solely by the dimensions of the transmission line on which the surge is propagating. $Z_0$ is called the characteristic impedance of the line and is very close to 300 $\Omega$ for typical open transmission lines.

An incident wave can always be considered to be the sum of several waves whose amplitudes add to the total amplitude. Let us say that any incident surge $(V_i,I_i)$ with $V_i>V_{th}$ is the sum of two waves, $(V_{th}, I_{th})+(V_s, I_s)$. The varistor clamps the voltage at $V_{th}$ by generating a reflected wave precisely equal to $(-V_s, I_s)$. The sum of the incident and reflected voltage waves is then $V_{th}$. In each case, the current in a wave is $V/Z_0$. See [Greenwood, 91, chapter 9] or [Feldman, 94, chapter 8] for details on transients on transmission lines. Note that the sum of the incident and reflected currents is $2I_s$. This is the current that flows through the arrester. For the largest surges, it can be tens of kiloamperes.

The energy which is absorbed by an arrester during a surge of time t is ~$V_{th}2I_st$. With $I_a$ in the thousands, $V_{th}$ approaching a million, and the surge duration 10 to 100 µs, the arrester is subject not only to thermal shock but also to high voltage stress. Failure modes include arc-over around the disks, failure to shut off at the end of the transient, and permanent damage to the ZnO disks which make up the arrester. If the arrester fails to shut off, the follow-on line power will cause it to explode. Internal arcing is similarly destructive.

The objective of the invention described herein is to detect the early signs of disk degradation that will eventually lead to destructive arrester failure. Since there is often a long period 13 months to years—between successive transients impinging on a particular arrester, early detection would allow a utility to schedule replacement and repair of the faulty arrester. The invention derives from the fact that the first sign of impending arrester failure is the collapse of the voltage across a single disk. Because of the extreme non-linearity of the varistors, the collapse of that one disk's voltage should be observable by the means discussed below.

FIG. 1A depicts a typical prior-art varistor 18 as comprising a number of series-connected ZnO disks 20-A, 20-B, ... 20-N. The disks typically comprise scintered zinc-oxide grains mixed with a complex amorphous inter-granular material. The ZnO disks have a cross-sectional area that provides a desired current-carrying capability, and have an axial length proportional to the standoff voltage required. A porcelain encapsulation (not shown) protects the disks, with terminal nodes being provided to facilitate electrical connection to the varistor stack.

It is standard surge arrester design to series-connect many varistors, perhaps hundreds, to obtain standoff voltages appropriate for high voltage applications. For example, if twenty substantially identical varistors 20-A, 20-B. etc. are series-connected and exposed to a peak line voltage of 200 KV, each varistor in the series stack should stand off approximately 10 KV with little current flow. The small leakage at normal line voltage assures a reasonably uniform division of the voltage among the set of varistors.

The arrester must turn-on and clamp reliably at a voltage levels that are only 40% to 60% above the maximum peak operating voltage. Once on, the thermal dissipation is substantial. Minimizing thermal shock requires uniform distribution of current across the disk area of the varistor. As the surge voltage level increases to values found on very high voltage transmission systems, it becomes impractical to ensure uniform distribution across the correspondingly very large diameter ZnO disks.

To scale arresters to the surges found on high-voltage transmission lines, it is common to parallel-couple two or more stacks of series-coupled varistors in shunt across the equipment or system to be protected. To ensure proper current sharing in the parallel stacks, the several stacks must be very closely matched with respect to I-V characteristics.

Although the individual disks in a series-coupled stack are well matched at the time of manufacture, aging inevitably cause the I-V characteristics of the disks and resultant stacks to vary slightly disk-to-disk, stack-to-stack. This drift increases the stress on the most conductive of the stacks. From time to time, a disk will crack, punch through or lose its stand-off capability. Such variations or failure can alter the I-V characteristics for the stack, as shown in FIG. 1B. Damage to one or more disks in a stack can rapidly accelerate the decline of the damaged stack. The objective of this invention is to detect degradation at the earlies possible stage to permit intervention before catastrophic failure occurs.

Disk cracking and punch-through failure mechanisms appear to be thermal in nature and to result from non-uniformity in the current distribution across the disk. It is generally believed that the non-uniformity derives from variation in the grain size in the sintered blocks comprising the disks. No prior art exists by which individual disk failures can be rendered observable under normal operating conditions.

The electrical effect of such a disk failure, at least during transient stress, is to short-out the failed disk. If there were N series-coupled disks in a varistor stack, a disk failure effectively reduces the stack to (N-1) disks. A varistor stack containing a failed disk will turn-on more rapidly than a varistor stack with no failed disks. More of the surge current will flow through the defective varistor stack and less through the remaining good stacks.

Table 1 depicts data for a 500 KV-class arrester that comprises a stack of 200 ZnO disks. As the applied voltage (column 1) increases, stack current increases (columns 2, 3, and 5). Significantly, the failure of one disk or two disks (columns 3 and 5, respectively) produces a substantial increase in current in the defective stack. For example, at 700 KV, 1.0 KA current ($I_o$) flows through a 200 disk stack containing no defective disks, but 1.134 KA current ($I_1$) flows through the same stack if one disk is defective (a current increase of 13.4%). 1.286 KA current ($I_2$) flows through the same stack if two disks are defective (a current increase of 28.6%).

On a percentage basis in this example, the differential in current flow between a good stack and a stack containing at least one failed disk is 13.4%. The percentage difference difference does not depend on the number of stacks but does depend, as would be expected, on the number of disks in a stack. For the highest voltages currently employed, a current differential exceeding about 7% will indicate a stack with at least one failed disk.

TABLE 1

| Voltage (KV) | 0 failed Current ($I_o$ A) | 1 failed Current ($I_1$ A) | ΔCurrent ($I_1/I_o$) (%) | 2 failed Current ($I_2$ A) | ΔCurrent ($I_2/I_o$) (%) |
|---|---|---|---|---|---|
| 600 | 21 | 24 | 13.4% | 27 | 28.6% |
| 610 | 32 | 36 | 13.4% | 41 | 28.6% |

TABLE 1-continued

| Voltage (KV) | 0 failed Current ($I_o$ A) | 1 failed Current ($I_1$ A) | ΔCurrent ($I_1/I_o$) (%) | 2 failed Current ($I_2$ A) | ΔCurrent ($I_2/I_o$) (%) |
|---|---|---|---|---|---|
| 620 | 48 | 55 | 13.4% | 62 | 28.6% |
| 630 | 72 | 81 | 13.4% | 92 | 28.6% |
| 640 | 106 | 121 | 13.4% | 137 | 28.6% |
| 650 | 157 | 178 | 13.4% | 202 | 28.6% |
| 660 | 230 | 260 | 13.4% | 295 | 28.6% |
| 670 | 335 | 379 | 13.4% | 430 | 28.6% |
| 680 | 485 | 549 | 13.4% | 623 | 28.6% |
| 690 | 698 | 791 | 13.4% | 897 | 28.6% |
| 700 | 1000 | 1134 | 13.4% | 1286 | 28.6% |
| 710 | 1426 | 1616 | 13.4% | 1833 | 28.6% |
| 720 | 2023 | 2293 | 13.4% | 2601 | 28.6% |
| 730 | 2856 | 3237 | 13.4% | 3671 | 28.6% |
| 740 | 4013 | 4548 | 13.4% | 5159 | 28.6% |
| 750 | 5613 | 6362 | 13.4% | 7216 | 28.6% |
| 760 | 7816 | 8859 | 13.4% | 10048 | 28.6% |
| 770 | 10837 | 12284 | 13.4% | 13932 | 28.6% |
| 780 | 14962 | 16960 | 13.4% | 19236 | 28.6% |
| 790 | 20574 | 23320 | 13.4% | 26451 | 28.6% |
| 800 | 28176 | 31938 | 13.4% | 36225 | 28.6% |

FIG. 1B depicts the above-noted increased current flow as a function of applied voltage for a 500 KV class varistor comprising 200 series-coupled ZnO disks. For example, at 760 KV, a varistor stack with zero defective disks will conduct about 7.8 KA, compared to about 8.9 KA if one disk was defective, and compared to about 10 KA if two disks were defective. One defective disk out of 200 disks represents 0.5%, but the failure of that single disk produces a 13.4% variation in relative varistor stack current (e.g., 8.9 KA/7.8 KA).

Consider the case of two parallel stacks of varistors 18, wherein one of the stacks includes one or more defective disks. From FIG. 1B, it is apparent that the stack with the defective disk(s) will turn-on more rapidly than the normal varistor stack. As a result, a larger than expected fraction of the surge current will flow through the defective stack, which must now withstand a greater thermal shock. This stress can cause more disk failures in the defective stack, with increased thermal shock on the next transient. Eventually arrester failure will result.

Sooner or later, the defective stack will fail in a violent, self-destructive fashion. However, the time from initial failure of a single disk to destruction of the varistor may be months or years. This relatively long interval can provide ample opportunity to replace the faulty disk or even the varistor stack, if it were somehow possible to know that a single disk in the varistor stack had failed.

The critical issue of current division between paralleled stacks with one defective varistor stack will now be described with reference to FIG. 2. FIG. 2 depicts a single-phase of a three-phase system or piece of equipment 10 coupled to the power grid via a transmission line 12 and a ground line 14. To protect the equipment 10 against surges, a varistor network 16 is placed across the voltage and ground nodes of equipment 10. It is placed as close to the protected equipment as is practical. In general, varistor network 16 comprises M parallel-coupled stacks of varistors, each stack comprising N series-coupled disks.

In FIG. 2, there are M=2 parallel-coupled stacks, stack 18 and stack 22. Stack 18 contains N series-coupled varistors or ZnO disks 20-A, 20-B, . . . , 20-N, and stack 22 contains N series-coupled varistors 24-A, 24-B, . . . , 24-N. The M parallel-coupled stacks are used to increase the network current handling capability beyond that possible with a single stack. For very high voltage transmission lines, N may be several hundred.

In the absence of a transient, varistor network 16 presents an essentially open circuit across system 10, with only a minute leakage current flowing through network 16.

In FIG. 2, a surge on the transmission line comes in from the left. A surge is a traveling wave. In any such wave, the ratio of the current and voltage of the wave is a constant: $V=\pm Z_0 I$, where $Z_0$, the characteristic impedance of the line, is normally very close to 300 Ω. When this wave impinges on the arrester 16, the unusually high voltage "turns on" the varistors. As stated above, we consider the surge to be made up of two waves, $(V_{th}, I_{th})+(V_s, I_s)$. The clamping action occurs because the arrester generates a reflected wave of $(-V_s, I_s)$. As a consequence, a total current of $2I_s=2V_s/Z_0$ flows in the arrester.

During a surge, the fraction of $2I_s$ flowing through each of M identical stacks will be $2I_s/M$. In the example of FIG. 2, since M=2, the surge current $2I_s$ will divide ideally with 50% through varistor stack 18 and 50% through varistor stack 22. Once a unit is installed in the field, it is virtually impossible with present technology to know that the M varistor stacks continue to have substantially identical I-V characteristics. Arresters have very long field lives, and normally require no maintanance other than occasional cleaning of the insulator. However, if a disk gets damaged, deterioration can be rather rapid.

By way of example, assume that stack 22 contains 200 good disks, but that stack 18 contains 199 good disks and 1 defective disk. Under surge conditions, as noted in Table 1 and FIG. 1b, the defective stack 18 will carry $1.06I_s$; the good stack will carry less $0.94I_s$. The excessive current through defective stack 18 can subject the good disks in that stack to damaging thermal stress. The extra thermal shock can cause more disks in stack 18 to fail. Eventually, stack 18 will self-destruct.

If one could detect that an individual disk had become defective, it could be replaced long before an expensive arrester failure. Such on-line detection is not currently available.

Prior art suggests using the same technique that is used to match stacks—that is, monitor the arrester V/I characteristics. For example, FIG. 1B suggests that, for a given surge current, a decreased voltage drop should appear across an arrester that includes a failed disk. Unfortunately, the circumstances of field operation make such an approach impractical. Making accurate V and I measurements at surge potentials and at the high frequencies present in lightning is extraordinarily difficult and expensive. Varistors operate at all times at high potential stress levels that preclude using inexpensive instrumentation to monitor such voltage drops. It would also be difficult to differentiate between those benign shifts in the V/I characteristics which result from aging or temperature and a shift caused by a disk failure in one stack.

Since a varistor stack may comprise several hundred disks in series, the voltage drop resulting from a single disk failure is extremely small. For the example of FIG. 1B, a 10% decrease in current through the good stack shows only an udetectable 0.04% change in voltage. Under the stress of a surge, voltage measurement to 5% would be considered impractically difficult.

Even if these instrumentation problems were overcome, temperature effects can render any measurements meaningless. ZnO varistor V/I characteristics vary with ambient temperature and with instantaneous temperature during discharge. Thus, a low voltage measured from a ZnO disk might indicate a cracked disk. However, the same low voltage might also be measured from a perfectly good disk exposed to a high ambient temperature.

There is a need for a self-calibrating warning mechanism whereby a defective ZnO varistor can be identified before catastrophic failure occurs. Such mechanism should be relatively inexpensive to implement, and must operate without exposing service personnel to risk of electrical shock.

The present invention provides such a mechanism.

SUMMARY OF THE PRESENT INVENTION

The present invention is used with a varistor array that includes M (M≧2) nominally identical parallel stacks of N series-coupled ZnO varistor disks. The difference in surge current between pairs of stacks in the array is monitored and differentially compared with the total current. Since the same voltage is perforce across all of the stacks, a varistor stack containing even one failed disk will conduct measurably more surge current than will non-defective stack(s). A differential in such current flow exceeding about 7% indicates that the stack with the excessive current flow contains at least one bad disk. In the example above, the difference is twice that. In the method proposed, the current difference is a directly measurable parameter. Thus, a very direct measurement of the critical parameter is achieved. To reduce this difference in current to a percentage, one must measure current as well as current difference. Percentage difference can then be obtained by either digital or analog signal processing.

The surge current flow in each stack is measured, preferably at the grounded stack end. To obtain sufficient accuracy, bandwidth and dynmaic range in the current transducers in today's technology, one would use precision Rogowski coils or current-sensitive fiber optics. Both of these devices can be operated in such a way as to sense directly the difference between two currents. They may also be operated in a way to sense a single current. Both devices can be scaled so that sensing whether the difference exceeds a percentage of the total current can be done directly, as will be shown in FIG. 3.

Using such detection and identification, the present invention can provide a warning enabling timely intercession before a single deffective disk escalates into a catastrophic arrester failure.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 1A:
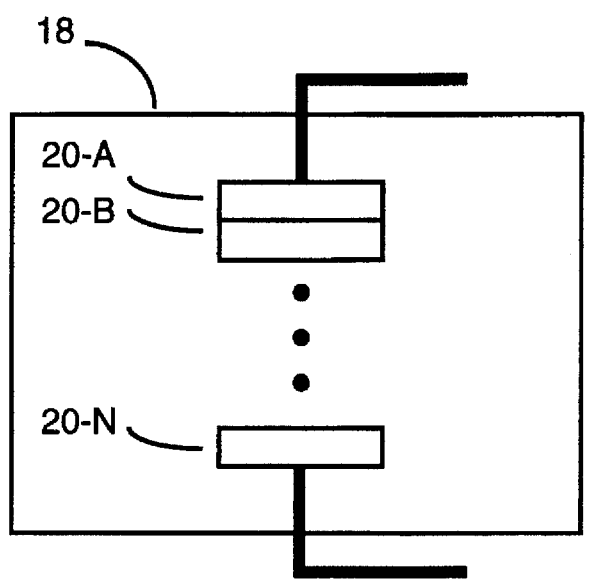
FIG. 1A depicts a multi-disk ZnO varistor.
Figure 1B:
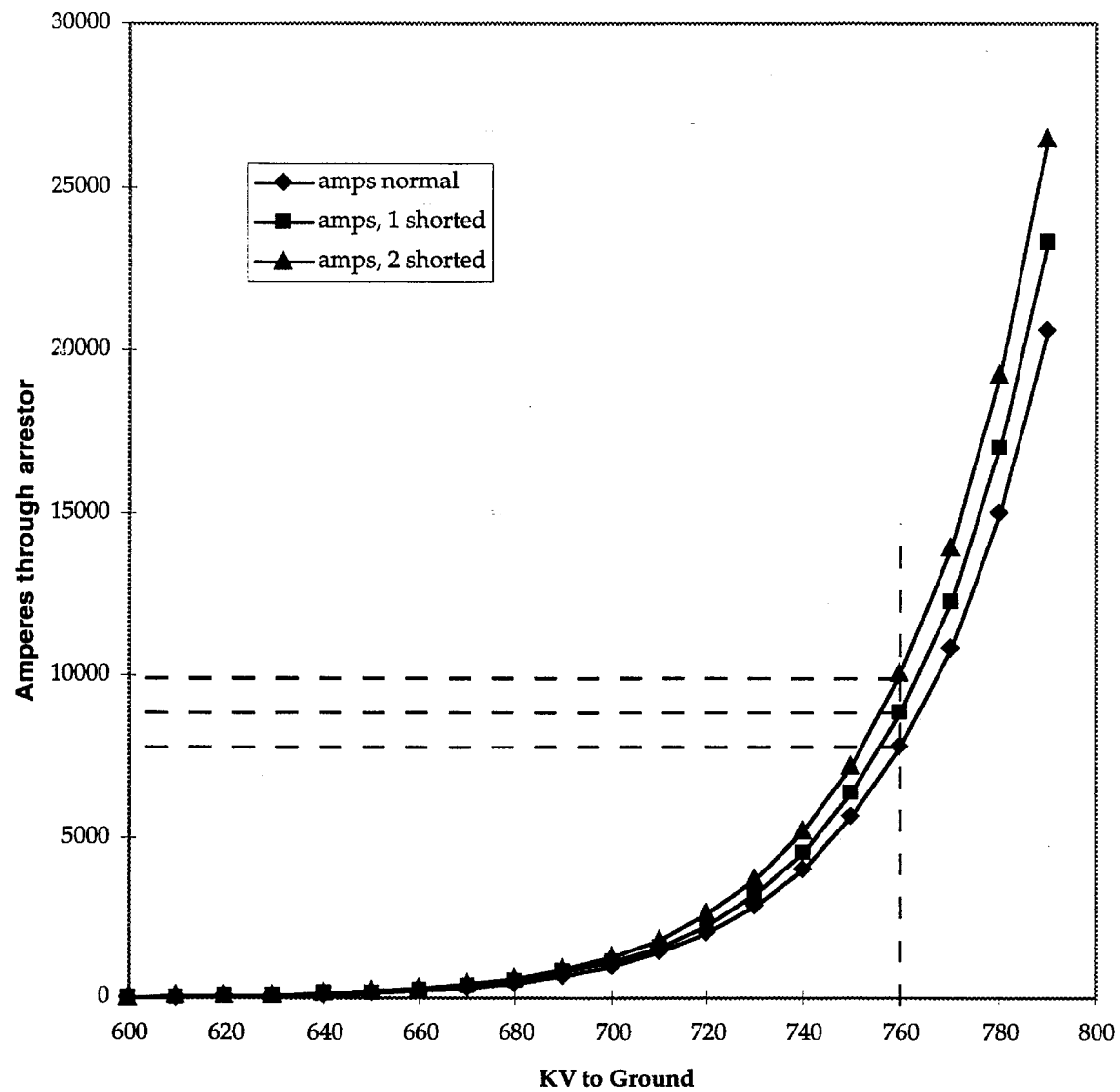
FIG. 1B depicts current versus voltage for a 500 KV class varistor such as shown in FIG. 1A, wherein 0, 1 or 2 ZnO disks have failed.
Figure 2:
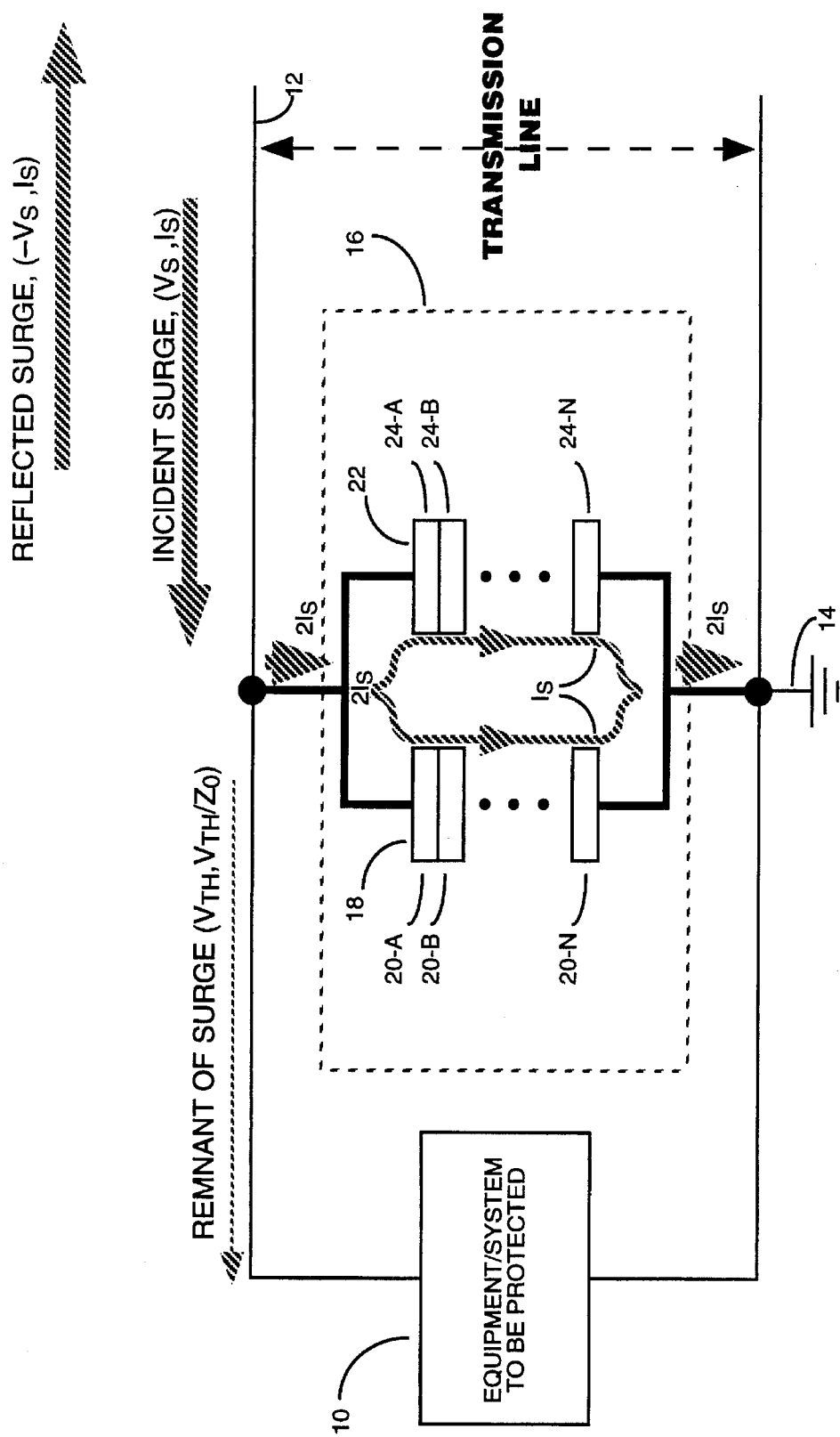
FIG. 2 depicts a conventional varistor network shielding equipment against a transient overvoltage, according to the prior art.
Figure 3:
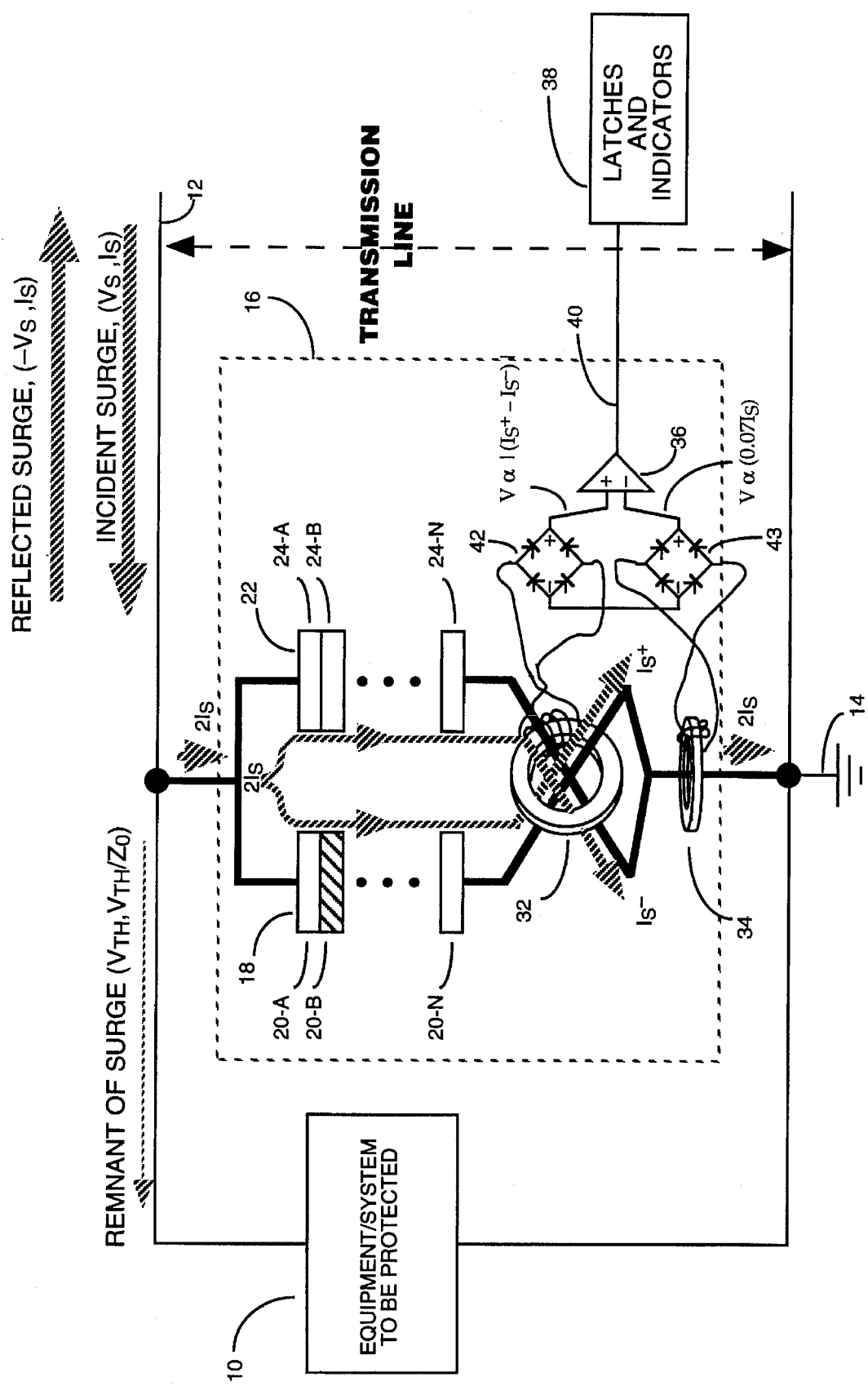
FIG. 3 depicts a system for detecting a failed varistor in a varistor network having M=2 parallel-coupled stacks of N varistors, using Rogowski coils to detect whether the differential surge current exceeds a fixed percentage of the total current, according to the present invention.

FIG. 3 depicts the present invention 30, preferably coupled to the lower voltage end (e.g., ground end) of a conventional varistor network 16. Varistor network 16 is used to protect equipment or system 10 against a surge appearing on power supply lines 12, 14. In FIG. 3, network 16 comprises M=2 parallel-coupled stacks 18, 22, each stack comprising N series-coupled varistors or ZnO disks. As such, varistor network 16 may be identical to what was described with respect to FIG. 2.

In FIG. 3, one of the varistors or varistor disks, here 20-B, is cross-hatched to indicate that it is defective, perhaps due to flashover, cracking, or punch-through. Of course, more than one disk may be defective, and the defective disk(s) may be anywhere in varistor network 16. Because of defective disk 20-B, stack 18 will conduct more current than will good stack 22 voltage.

The current through the defective stack 18 will be $I_s^+$ and the current through the non-defective stack 22 will be $I_s^-$, where $2I_s$ is the arrester current necessary to clamp the voltage at $V_{th}$. In large, transmission-class arresters, the difference typically will exceed 8%. In smaller arresters, the difference will be even greater. Thus, if stacks 18, 22 were nominally "matched" before the failure of disk 20-B, then at least 8% more current will flow through the defective stack than will flow through any of the non-defective stacks. This differential in current provides a reasonable basis for detecting presence of a varistor stack containing at least one failed disk, according to the present invention.

In practice, the above-referenced 8% current flow differential represents a minimum threshold figure for identifying a defective stack. For example, in a 500 KV varistor stack, the failure of one disk in a series of N=200 disks can produce a 13.4% differential current flow between a defective stack and a good stack. In a 760 KV class varistor stack stressed to the same level (i.e., with 306 disks), the failure of one disk would produce an 8.5% differential current flow between a defective stack and a good stack. Since 765 KV-class equipment is today's highest AC voltage, the 8.5% differential is the smallest value that must be sensed.

The detection scheme shown in FIG. 3 is one of several embodiments of the invention that can be realized directly with present-day technology. The method shown employs precision Rogowski coils 32 and 34 [Ramboz, 95]. (The pickup coils are shown as localized for clarity, but a Rogowski winding is always uniformly distributed around the toroid.) The output of a Rogowski coil is directly proportional to the rate of change of current through the window of the coil. Note that the currents flowing in the two stacks 18 and 22 pass through coil 32 in opposite directions. The net current through coil 32 is thus $(I_s^+ - I_s^-)$. Both currents flow together through coil 34. Thus, it sees $2I_s$, the total current. By scaling the turns ratios on the two coils, one can make the output voltage of coil 34 proportional to the rate of change of, say, $0.07I_s$ or any other desired threshold value, such as 10%, while the output of coil 32 is directly proportional to the rate of change of $(I_s^+ - I_s^-)$. These two signals are then passed to the bridge rectifiers, 42a and 42b, and then to the integrating comparator 36. The comparator has two output states, 0 and 1. The output is 0 if the '−' terminal voltage exceeds '+' terminal voltage and 1 if the opposite state exists. The output of the integrating comparator, which goes positive only if $|I_s^+ - I_s^-| > |0.07I_s|$ is passed by an optical downlink 40 to the latches and indicators 38 which record the occurrence of a failed-disk signal from the comparator.

Various types of sensors may be used as current monitors 32, 34 to deliver an output signal proportional to the measured current flow. Besides Rogowski coils, fiber-optic sensors, and current transformers can be used in a manner very similar to that shown in FIG. 3 to obtain a difference signal. The fiber-optic sensor would have the advantage of having only passive, non-conducting glass fibers anywhere near the arrester. This would make it much easier to maintain a low-noise detection environment during the transient. For the fiber-optic sensor, the ratio must be taken as the difference in rotation of the two sensors 32 and 34. Various arrangements of polarizers and analyzers can be used to achieve the same ratio comparison as shown for the Rogowski coils in FIG. 3. The Rogowski coil and the fiber-optic sensor have both the bandwidth and the dynamic range to handle the expected currents. The current transformer's bandwidth and dynamic range suffer in comparison to either the fiber-optic or Rogowski transducers, but they are a very well understood methodology which could be stretched to work in this application.

With further reference to FIG. 3, it will be appreciated that the output from comparator 36 will be zero if the current flow through each current stack is substantially equal. Thus, a zero output from comparator 36 permits the presumption that neither varistor stack contains a defective varistor or disk. Although both varistor stacks could contain a defective varistor or disk, the likelihood that two simultaneous and equal failures is small. Furthermore, if more than two stacks are present, each current is differenced against two others in separate sensors, so with M stacks, it would require a uniform M failures (1 per stack) to mask all the failures from differential detection.

The output signal from comparator 36 does not indicate which of the two stacks contains the defective disk. That information is available by detecting whether the polarity of the signal from coil 32 is the same or opposite to that of coil 34. Circuitry to detect polarity difference is well known in both fiber-optic and analog circuit arts. Such detection circuitry is not shown in FIG. 3.

Those skilled in the art will recognize that comparator 36 and indicator(s) 38 are simply indicative of the signal processing which would be done. The outputs at 32 and 34 could be filtered by both analog or digital means and that the filtered signals could be stored locally or transmitted to central data collecting systems such as SCADA, as is now common in power-system monitoring.

Furthermore, since the current through the stacks as well as the differential current between stacks is monitored, this instrument can provide data on the severity of service for each arrester to which it is connected. It would permit a SCADA system to record not only the number of lightning strikes or switching surges but also the severity of each strike. Such data is essential to do the remaining-service-life estimations and timely replacement which has become so central to economic operation of a utility. These data are not now available.

⇒

Figure 4:
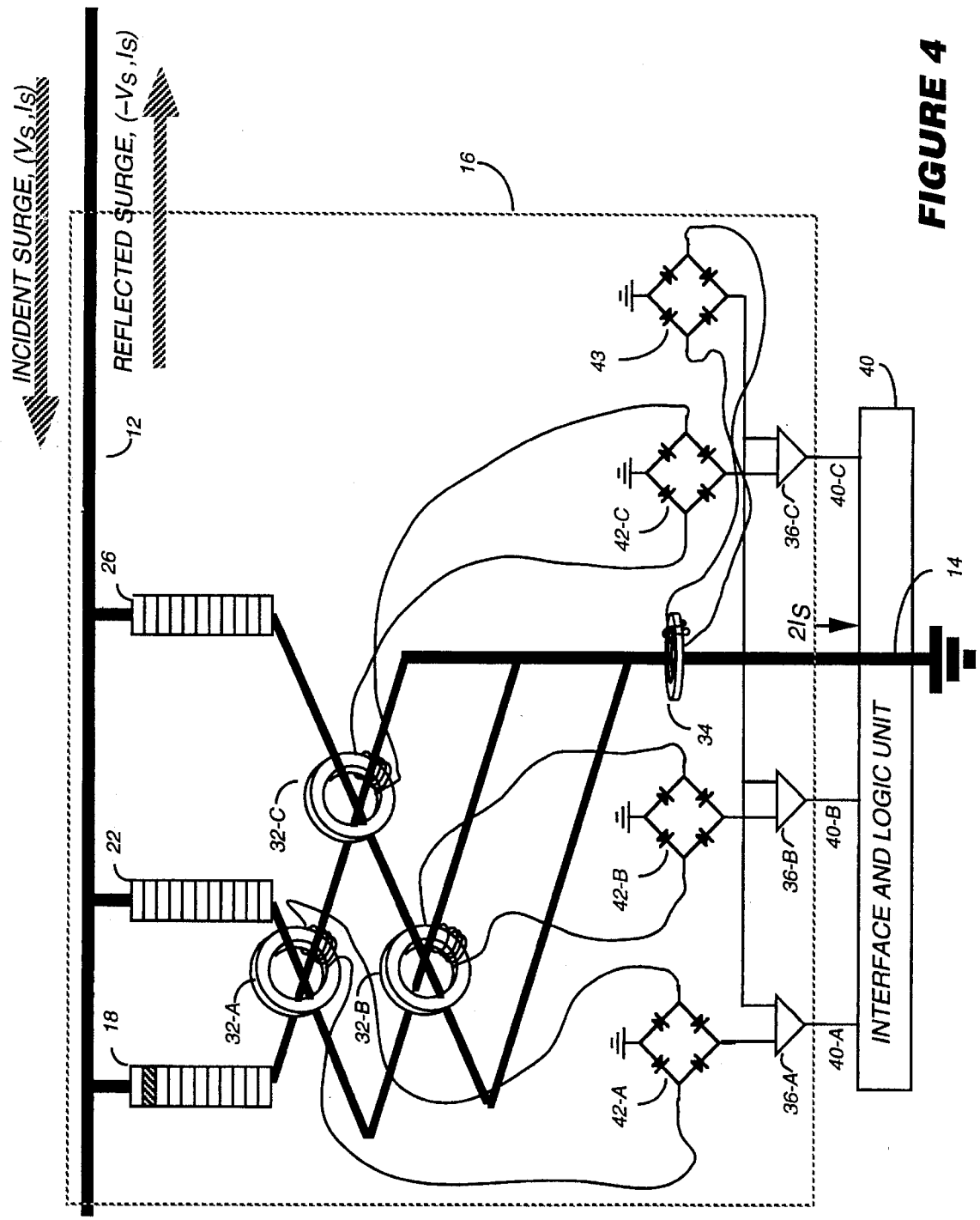
FIG. 4 depicts a system using the present invention for detecting a failed varistor in a generalized varistor network (M=3 shown)

FIG. 4 shows a generic configuration wherein a varistor network 16 comprises M=3 varistor stacks denoted respectively as elements 18, 22, 26. Network 16 is connected between power supply lines 12 and 14 (here, ground). The protected equipment (not shown) would be connected immediately to the left of the figure. In FIG. 4, one of the varistor disks in stack 18 is defective, as depicted by its crosshatching.

In FIG. 4, each differential current transducer, i.e., 32-A, 32-B and 32-C, is a Rogowski coil with the ground leads of two stacks run through the window in opposite sense. As in FIG. 3, percentage current-differential is obtained by comparing the outputs of the differential current transducers 32 with the total current transducer 34. The comparison is done by integrating comparators 36 and transmitted to a remote interface and logic unit 40 over optical downlinks 40. What is noteworthy in difference between FIGS. 3 and 4 is the method for dealing with more than two stacks. The method is scalable to any number M>2 and provides increased security through redundancy. What is done is to have the current from each varistor compared independantly with the current through two or more other varistors. A faulty disk (in stack 18 in this example) will cause two low readings. This both identifies the errant stack and doubles the chance of catching the bad disk signal. Furthermore, it offers detection of the rare case of two disks failing in two different stacks.

To recapitulate, the present invention monitors percentage differential surge-current flow through the lower potential end of each varistor stack in a varistor network. If one stack is found to conduct substantially more current than the remaining stack(s), it is presumed to contain a defective ZnO disk. The output of the detection network can be monitored by local circuitry or collected at a central point over a SCADA network. In this fashion, the defective varistor stack may be noticed and replaced before subsequent overvoltage surges can result in catastrophic damage to the varistor network and/or equipment. Proper performance can also be monitored and used to estimate life remaining in the surge arresters.

Modifications and variations may be made to the disclosed embodiments without departing from the subject and spirit of the invention as defined by the following claims.

| References | |
|---|---|
| [Feldman, 94] | Feldman, J.M. & C.T. Retter, "Computer Architecture", McGraw Hill, 1994 |
| [Greenwood, 91] | Greenwood, Allan, "Electrical Transients in Power Systems", second edition, Wiley, 1991. |
| [Ramboz, 95] | Ramboz, John, "Machinable Rogowski Coil, Design and Calibration", Inst. Meas. & Tech Conf. Proceedings, Nov. 1995. |

What is claimed is:

1. In a varistor network comprising M≧2 parallel-coupled stacks of varistors, each stack containing a plurality of disks, a method of detecting a defective disk in one of the M stacks, the method comprising the following steps:

(a) measuring a difference in stack surge current flowing through each pair of stacks comprising said M stacks;

(b) measuring total current (I) through said M stacks;

(c) comparing stack surge current differences measured in step (a) for each pair of stacks with total current I divided by M to detect whether stack surge current flowing through any one of said M stacks exceeds a fixed fraction of total surge current flowing through said varistor network;

wherein a said stack detected in step (c) as conducting such excessive stack surge current is identified as containing at least one defective disk.

2. The method of claim 1, wherein step (a) includes coupling a differential current sensor to a ground-potential end of each pair of stacks comprising said M parallel-coupled stacks.

3. The method of claim 1, wherein step (a) includes coupling at least one current sensor selected from the group consisting of (i) a Rogowski coil, (ii) a current transformer, and (iii) a fiber optic current sensor.

4. The method of claim 1, wherein step (a) further includes comparing current differential to total current in a polarity-independent manner.

5. The method system of claim 1, wherein step (c) includes quantizing results of said comparing into a PASS state or a FAIL state.

6. The method of claim 1, further including a step (d) of storing current data for use in determining lifetime stress for said varistor network.

7. The method of claim 1, wherein at step (c) data is stored locally.

8. The method of claim 1, further including a step (d) of providing an indicator responsive to a determination made at step (c), said indicator signalling at least one warning selected from a group consisting of (i) presence of a defective disk in a said stack, and (ii) identification of a said stack containing a defective disk.

9. The method of claim 1, further comparing current flow in each stack against current flow in at least two other stacks; wherein redundancy is provided in detecting a failed if two different stacks contain defective disks.

10. The method of claim 1, further including a step (d) of transmitting current data to a central data collection system for use in determining lifetime stress for said varistor network.

11. The method of claim 1, wherein at step (c) data is transmitted over SCADA lines to a central data collection system.

* * * * *